(12) United States Patent
Bristol et al.

(10) Patent No.: US 7,567,379 B2
(45) Date of Patent: Jul. 28, 2009

(54) TECHNIQUE TO PREVENT TIN CONTAMINATION OF MIRRORS AND ELECTRODES IN AN EUV LITHOGRAPHY SYSTEM

(75) Inventors: Robert Bristol, Portland, OR (US);
Bryan J. Rice, Hillsboro, OR (US);
Ming Fang, Portland, OR (US); John P. Barnak, Beaverton, OR (US); Melissa Shell, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 995 days.

(21) Appl. No.: 10/835,867

(22) Filed: Apr. 29, 2004

(65) Prior Publication Data

US 2005/0244572 A1 Nov. 3, 2005

(51) Int. Cl.
*F21V 9/04* (2006.01)
(52) U.S. Cl. ............... 359/360; 359/838; 378/156; 313/114
(58) Field of Classification Search .............. None
See application file for complete search history.

(56) References Cited

U.S. PATENT DOCUMENTS

| | | | |
|---|---|---|---|
| 5,958,605 A * | 9/1999 | Montcalm et al. | 428/627 |
| 6,667,484 B2 | 12/2003 | Koshelev et al. | |
| 6,986,971 B2 * | 1/2006 | Han et al. | 430/5 |
| 2002/0012797 A1 | 1/2002 | Bijkerk et al. | |
| 2004/0002009 A1 | 1/2004 | Yan | |
| 2004/0079902 A1* | 4/2004 | Bristol | 250/504 R |
| 2006/0175616 A1 | 8/2006 | Chandhok et al. | |

OTHER PUBLICATIONS

Resource for Computing X-ray Reflectivity of a Thick mirror. Screenshot printed on Apr. 7, 2008. *Available at* http://henke.1bl.gov/optical_constants/mirror2.html.

Studnitzky, T. and Schmid-Fetzer, R., "Phase formation and reaction kinetics in M-Sn systems (M =Zr, Hf, Nb, Ta, Mo)," *Zeitschrift für Metallkunde, International Journal of Materials Research and Advanced Techniques*, Aug. 2002, Carl Hanser Verlag, München, Z. Metallkd., vol. 93, Aug. 2002, pp. 894-903. *Available at* http://www.hanser.de/zeitschriften/MK.

Prasad, A.K. et al., "Reactively sputtered MoO,films for ammonia sensing," *Science Direct, Thin Solid Films* 436 (2003) 46-51, 2003 Elsevier Science B.V., pp. 46-51. *Available online at* www.sciencedirect.com.

Henke, B.L. et al., "X-Ray Interactions: Photoabsorption, Scattering, Transmission, and Reflection at $E$=50-30,000 eV, $Z$=1-92," *Atomic Data and Nuclear Data Tables* 54, 181-342 (1993), Academic Press, Inc., pp. 181-342.

Bonakdarpour, A. et al., "Combinatorial synthesis and rapid characterization of $Mo_{1-x}Sn_x$ ($0 \leq x \leq$) thin films," *Science Direct, Thin Solid Films* 440 (2003) 11-18, 2003 Elsevier Science B.V., pp. 11-18. *Available online at* www.sciencedirect.com.

(Continued)

*Primary Examiner*—Arnel C Lavarias
*Assistant Examiner*—Derek S Chapel
(74) *Attorney, Agent, or Firm*—Fish & Richardson P.C.

(57) ABSTRACT

Passivation coatings and gettering agents may be used in an Extreme Ultraviolet (EUV) source which uses tin (Sn) vapor as a plasma "fuel" to prevent contamination and corresponding loss of reflectivity due to tin contamination. The passivation coating may be a material to which tin does not adhere, and may be placed on reflective surfaces in the source chamber. The gettering agent may be a material that reacts strongly with tin, and may be placed outside of the collector mirrors and/or on non-reflective surfaces. A passivation coating may also be provided on the insulator between the anode and cathode of the source electrodes to prevent shorting due to tin coating the insulator surface.

10 Claims, 3 Drawing Sheets

OTHER PUBLICATIONS

Amor et al., "Influence of the temperature on the properties of sputtered titanium oxide films," Materials Chemistry and Physics 77, pp. 903-911 (2002).

Sonawane et al., "Preparation of titanium (IV) oxide thin film photocatalyst by sol-gel dip coating," Materials Chemistry and Physics 77, pp. 744-750 (202).

Mitchell et al., "Transmission electron microscopy studies of atomic layer deposition $TiO_2$ films grown on silicon," Thin Solid Films 441, pp. 85-95 (2003).

Rodriguez et al., "Photo-electrocatalytic degradation of 4-chlorophenol over sputter deposited Ti oxide films," Thin Solid Films 360, pp. 250-255 (2000).

Abou-Helal et al., "Preparation of $TiO_2$ thin films by spray pyrolysis to be used as a photocatalyst," Applied Surface Science 195, pp. 53-62 (2002).

Koshizaki et al., "Preparation of nanocrystalline titania films by pulsed laser deposition at room temperature," Applied Surface Science 197-198, pp. 624-627 (2002).

Abe, R., et al., "A new type of water splitting system composed of two different $TiO_2$ photocatalysts (anatase, rutile)and a $IO_3/I$ shuttle redox mediator", *Chemical Physics Letters*, 344(3):339-344, Aug. 2001.

Friend, C.M., et al., "Structure and reactivity of thin-film oxides and metals", *Applied Surface Science*, 142(1):99-105, Apr. 1999.

Fujishima, A., et al., "Electrochemical Photolysis of Water at a Semiconductor Electrode", *Nature*, 238(5358):37-38, Jul. 1972.

Klebanoff, L.E., et al., "Use of gas-phase ethanol to mitigate extreme UV/water oxidation of extreme UV optics", *J. Vac. Sci. Technol. A*, 22(2):425-432, Mar. 2004.

Ogi, H., et al., "Activation of $TiO_2$ photocatalyst by single-bubble sonoluminescence for water treatment", *Ultrasonics*, 40(1-8):649-650, May 2002.

Underwood, J.H., et al., "Tarnishing of Mo/Si multilayer x-ray mirrors", *Applied Optics*, 32(34):6985-6990, Dec. 1993.

* cited by examiner

# TECHNIQUE TO PREVENT TIN CONTAMINATION OF MIRRORS AND ELECTRODES IN AN EUV LITHOGRAPHY SYSTEM

BACKGROUND

Lithography is used in the fabrication of semiconductor devices. In lithography, a light sensitive material, called a "photoresist", coats a wafer substrate, such as silicon. The photoresist may be exposed to light reflected from a mask to reproduce an image of the mask. When the wafer and mask are illuminated, the photoresist undergoes chemical reactions and is then developed to produce a replicated pattern of the mask on the wafer.

Extreme Ultraviolet (EUV) lithography is a promising future lithography technique. EUV light may be produced using a small, hot plasma that will efficiently radiate at a desired wavelength, e.g., in a range of approximately 11 nm to 15 nm. The plasma may be created in a vacuum chamber, typically by driving a pulsed electrical discharge through the target material or by focusing a pulsed laser beam onto the target material. The light produced by the plasma is then collected by nearby mirrors and sent downstream to the rest of the lithography tool.

The hot plasma tends to erode materials nearby, e.g., the electrodes in electric-discharge sources. The eroded material may coat the collector optics, resulting in a loss of reflectivity and reducing the amount of light available for lithography. Furthermore, in sources that use a metal vapor, such as tin or lithium, the plasma "fuel" itself may contaminate collector mirror surfaces, further reducing reflectivity.

DETAILED DESCRIPTION

Figure 1:
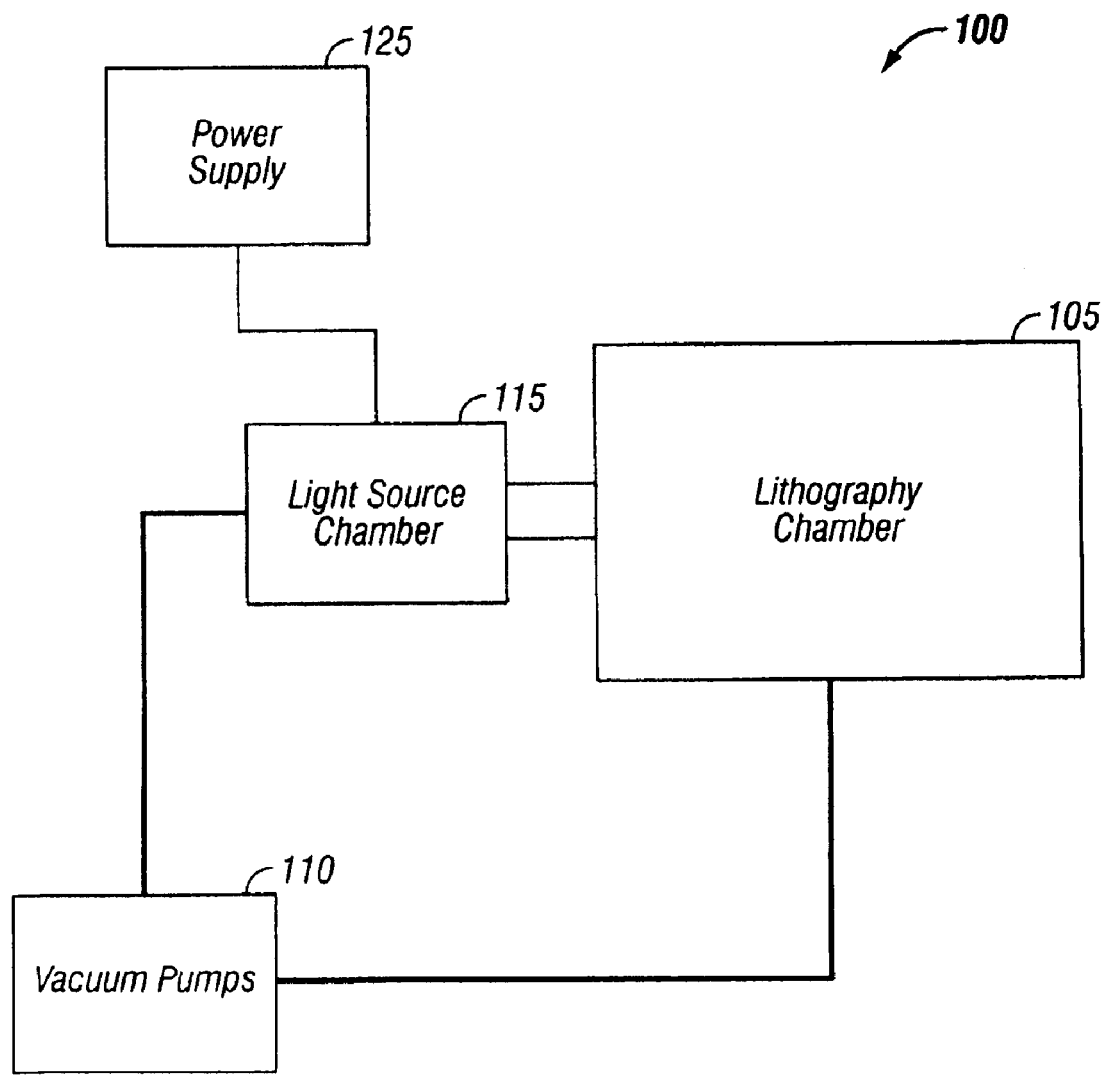
FIG. 1 is a block diagram of a lithography system.

FIG. 1 shows a lithography system 100. A wafer, coated with a light sensitive coating ("photoresist"), and a mask may be placed in a lithography chamber 105. The pressure in the lithography chamber 105 may be reduced to a near vacuum environment by vacuum pumps 110. A light source chamber 115, which houses a light source, is connected to the lithography chamber 105. The pressure in the light source chamber may also be reduced to a near vacuum environment by the vacuum pumps 110. The light source chamber and lithography chamber may be separated by a valve which may be used to isolate the chambers. This allows for different environments within the different chambers.

The light source chamber 115 may be an EUV chamber, which houses an EUV light source. A power supply 125 is connected to the EUV chamber to supply energy for creating an EUV photon emitting plasma, which provides EUV light for lithography. The EUV light may have a wavelength in a range of 11 nm to 15 nm, e.g., 13.5 nm. The source may be a plasma light source, e.g., a laser-produced plasma (LPP) source, discharge-produced plasma (DPP) source, or a pinch plasma source. Plasma-producing components, such as electrodes, in the EUV source may excite a gas to produce EUV radiation. The gas may be, e.g., an ionized cluster of a rare gas such as xenon (Xe) or a metal vapor such as tin (Sn), lithium (Li), or tin oxide ($SnO_2$). The EUV chamber may be evacuated by the vacuum pumps 110.

Figure 2A:
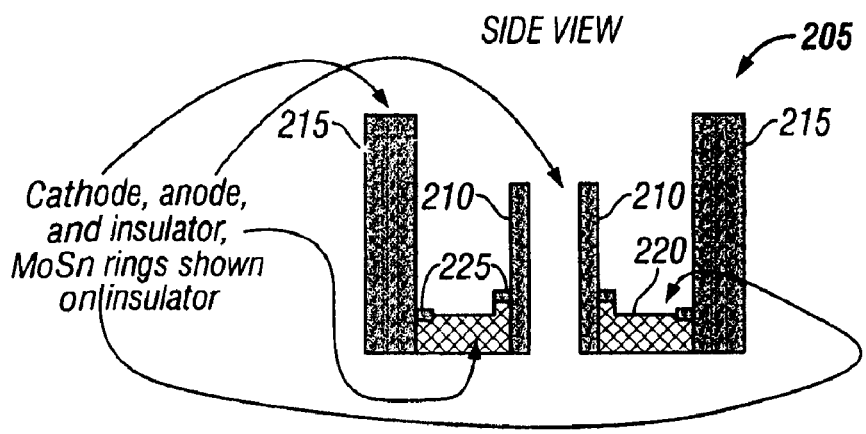
FIG. 2A is a sectional view and FIG. 2B is a top view of a discharge-produced plasma light source.

FIG. 2A show sectional and top views, respectively, of an exemplary DPP source 205. The DPP source includes a pair of electrodes (anode 210 and cathode 215) which delivers energy into the target material, which is emitted from the central anode 210, to create an EUV-emitting plasma.

Figure 3:
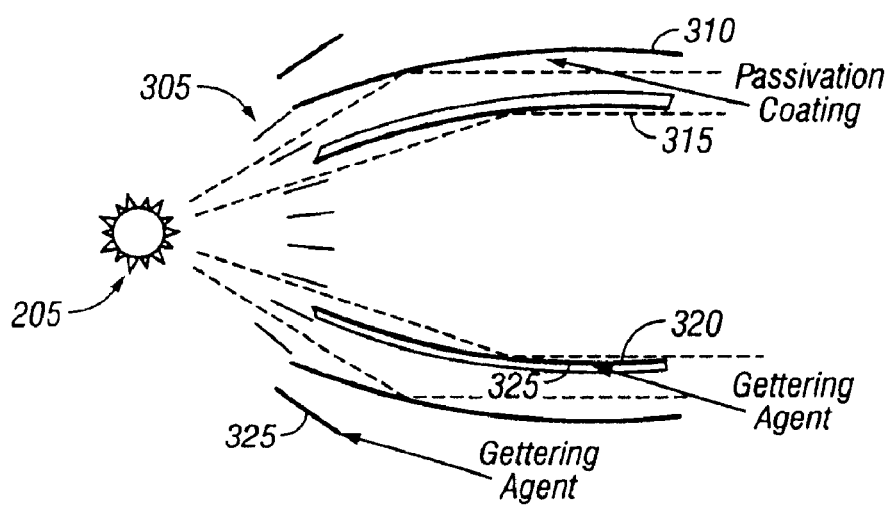
FIG. 3 is a sectional view of a light source chamber.

FIG. 3 shows a sectional view of an exemplary EUV chamber. Inside the EUV chamber are the light source, in this case DPP source 205, and collector mirrors 310 for collecting and directing the EUV light 315 for use in the lithography chamber 105. The collector mirrors 310 may be multilayer silicon (Si)/molybdenum (Mo) mirrors and have a nominally conical/cylindrical structure.

"Foil traps" 305 may be placed between the source and the collector mirrors for debris mitigation. The foil traps include a series of thin parallel plates to capture particles due to their Brownian motion. However, some of the plasma "fuel" may pass through the foil traps. An inert gas, such as xenon, may not cause much damage to the collector mirrors. Another plasma fuel, tin vapor, may produce more EUV than xenon and has shown potential as a high yield fuel for EUV sources. Unlike xenon, tin vapor has the capacity to damage the collector mirrors. Debris particles from the tin vapor that make it through the foil traps may adhere to the collector mirrors, resulting in a loss of reflectivity.

In an embodiment, tin vapor is used as the fuel for the EUV source. To prevent tin vapor from coating the collector mirrors, a passivation coating 320 may be provided on the reflective surfaces in the EUV chamber and tin-gettering agents 325 provided elsewhere in the EUV chamber.

The passivation material 320 may be selected from materials to which tin does not adhere and which react very slowly with tin. Since the passivation coating may be placed on the reflective surface of the collector mirrors, the passivation material, and thickness, should not overly affect the reflectivity of the mirrors. Such materials include, for example, molybdenum oxide ($MoO_x$, where $x \geq 1$) and molybdenum tin (MoSn). Table 1 shows values for reflectivity at 13.5 nm (EUV) and 10 degrees with zero surface roughness.

TABLE 1

| | |
|---|---|
| Bulk Mo | 92% |
| Bulk tin | 45% |
| Bulk Mo + 1 nm MoO | 89% |
| Bulk Mo + 1 nm MoSn | 77% |
| Bulk Mo + 3 nm MoO | 85% |
| Bulk Mo + 3 nm MoSn | 63% |
| Bulk Ru (ruthenium) | 87% |

Metallic tin does not adhere with molybdenum oxide. In addition, experiments have shown that tin reacts very slowly with molybdenum oxide even at temperatures as high as 1000° C. The reaction rate of molybdenum (with a native oxide) with tin has been found to be many orders of magnitude less than that with other tin-metal pairs. Using an Arrhenius-type reaction rate to extrapolate the rates measured at 800° C.-1200° C. to that at about 200° C. (a more realistic collector mirror temperature), it can be shown that it would take about a year to grow 1 nm of tin on a molybdenum surface. Although the error bars for such an extrapolation are relatively large, the extrapolation illustrates that the reaction is very slow. These measurements were also done with liquid tin; rates with a small partial pressure of tin in an EUV source (e.g., $10^{-2}$ Torr or less) would likely be even less.

While any bare surface of molybdenum will grow a native oxide, in an embodiment, a relatively thick (e.g., 1 nm to 3 nm) oxide may be grown in a controlled fashion to ensure that the surface is robust and remains smooth. In addition, the oxide surface may be re-grown in situ by bleeding in a small amount of oxygen to the vacuum chamber. Surface coatings of 3 nm or less may provide acceptable reflectivity (as shown in Table 1).

In an embodiment, a molybdenum oxide coating is grown in a controlled manner by first cleaning the bare molybdenum surface in an ultra-high vacuum (UHV) chamber and then growing the oxide in a controlled furnace. This may produce a much thicker and uniform coating than a native oxide, which may be more robust and reflective than the native oxide.

The collector mirrors may be cleaned in or out of the lithography tool. Cleaning may remove some of the passivation coating. The mirrors may be recoated in-tool by bleeding oxygen into the chamber or out-of-tool using the controlled growth technique described above.

Molybdenum oxides with different stoichiometries may be used (e.g., x=1, 1.1, 1.2, ... ). For example, in an embodiment, x=3 ($MoO_3$). Molybdenum oxides having other stoichiometries may oxidize to $MoO_3$ over time in the operating environment of the EUV chamber.

In an alternative embodiment, molybdenum tin may be used for the passivation coating. It has been shown that a phase of molybdenum tin forms as an interstitial passivation layer between molybdenum and tin in reactions between the two elements. Molybdenum oxide may have better "tin-shedding" properties than molybdenum tin, in which case a tin-shedding molybdenum oxide coating may be grown over the molybdenum tin coating. Molybdenum tin may be formed by sputter deposition of tin on the molybdenum substrate. As shown in Table 1, a 1 nm coating of molybdenum tin (which is well within demonstrated controllable limits) has nearly 90% of the reflectivity of ruthenium (a current candidate for collector mirror material for EUV sources utilizing xenon as a plasma fuel), which should be acceptable considering the substantial power improvement of tin over xenon.

FIG. 3 depicts a grazing-incidence collector in which the mirror material is a bulk metal. However, the passivation coating described above may also be used with normal-incidence Si/Mo-multilayer mirrors, with the molybdenum oxide being grown on a final layer of molybdenum.

As described above, a gettering agent 325 may be placed in the chamber to actively absorb tin vapor and thus minimize the number of times a tin atom bounces around the chamber. The gettering material may be selected from materials which react strongly (and quickly) with tin. Such materials include, for example, copper (Cu), nickel (Ni), and ruthenium (Ru). Copper, for example, reacts about $10^8$ times as fast as molybdenum oxide. However, it may be desirable to use nickel or ruthenium if copper contamination is an issue. The gettering agent 325 may also be actively cooled to increase its affinity for tin (as well as other impurities).

The gettering agent 325 may be placed in various locations in the EUV chamber. For example, the gettering agent may be placed outside of the collector mirrors. The gettering agent may also be coated onto the back (non-reflecting) surface of the collector mirrors.

Figure 4:
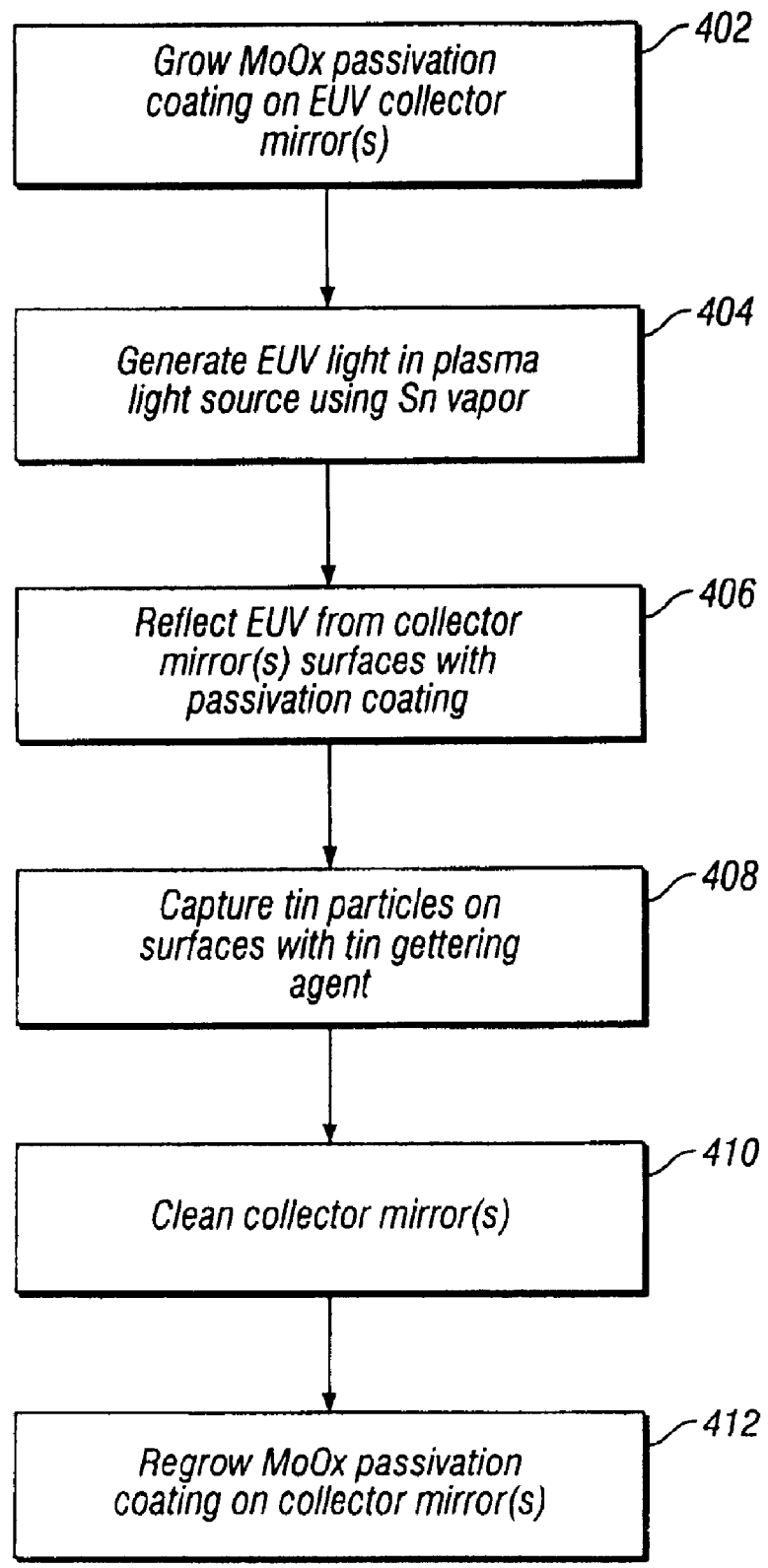
FIG. 4 is a flowchart describing a technique to prevent tin contamination of mirrors in an extreme ultraviolet lithography (EUVL) system.

FIG. 4 is a flowchart describing a technique to prevent tin contamination of mirrors in an EUV lithography (EUVL) system. A molybdenum oxide passivation layer may be grown on collector mirror(s) for use in the EUV lithography system (block 402). The EUVL system may generate EUV light using tin vapor as a fuel (block 404). The EUV light may be reflected from the surfaces of the collector mirror(s) including the molybdenum oxide passivation coating (block 406). Tin vapor that enters the collector may be captured by surfaces including a tin gettering agent (block 408). The collector mirror(s) may be cleaned occasionally, e.g., with an etch cleaning process (block 410). Portions of the passivation coating removed during the cleaning operation may be replaced by regrouping a molybdenum oxide on the collector mirror(s) (block 412).

Figure 2B:
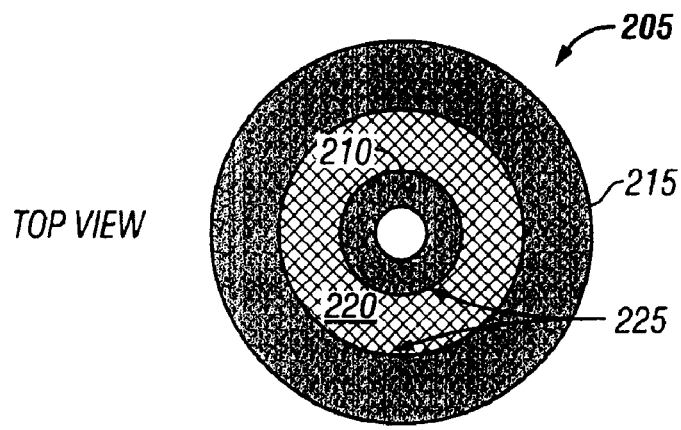

Another potential problem associate with using tin vapor as a fuel for the EUV source is that tin from the tin vapor may deposit onto and coat the insulating material 220 (FIGS. 2A and 2B) between the anode 210 and cathode 215 in the EUV source, thereby electrically shorting the insulator. In an embodiment, a passivation coating 225 may be deposited on the insulator to prevent shorting due to tin vapor contamination. The passivation coating may cover the entire surface of the insulator or may be deposited in rings (as shown in FIGS. 2A and 2B). The passivation material may be, e.g., molybdenum oxide or molybdenum tin.

The orthorhombic phase of $MoO_3$ has been shown to be a good insulator. For example, the resistance of 150 nm films of $MoO_3$ ion-beam sputtered (in a 1:1 argon:oxygen secondary plasma) onto alumina oxide ($Al_2O_3$) substrates have demonstrated resistances as high as $10^9$ Ohms. Alumina oxide is a leading candidate material for electrode insulators.

A number of embodiments have been described. For example, steps in the flowchart may be skipped or performed out of sequence and still provide desirable results. Nevertheless, it will be understood that various modifications may be made without departing from the spirit and scope of the invention. Accordingly, other embodiments are within the scope of the following claims.

The invention claimed is:

1. An apparatus comprising:
   a collector mirror including a reflective surface to reflect extreme ultraviolet (EUV) light; and
   a passivation coating on the reflective surface, the passivation coating comprising a layer of molybdenum oxide on a layer of molybdenum tin.

2. The apparatus of claim 1, wherein the reflective surface comprises molybdenum.

3. The apparatus of claim 1, wherein the passivation coating has a thickness in a range of approximately 1 nm to approximately 3 nm.

4. The apparatus of claim 1, wherein the passivation coating comprises an oxide grown on the reflective surface.

5. The apparatus of claim 1, further comprising:
a surface including a gettering agent.

6. The apparatus of claim 5, wherein the gettering agent comprises at least one of copper, nickel, and ruthenium.

7. The apparatus of claim 1, wherein the collector mirror further comprises:
a non-reflective surface; and
a gettering agent on the non-reflective surface.

8. The apparatus of claim 7, further comprising:
an EUV source chamber including
a plasma source to generate a plasma radiating EUV light from a tin vapor,
the collector mirror, and
a second collector mirror having a reflective surface including a passivation coating adjacent the non-reflective surface of the collector mirror.

9. The apparatus of claim 1, wherein the passivation coating on the reflective surface comprises an interface between molybdenum metal and one of the molybdenum oxide and molybdenum tin.

10. The apparatus of claim 9, wherein:
the interface comprises an interface between molybdenum metal and molybdenum oxide; and
the interface is characteristic of the molybdenum oxide having been grown from the molybdenum metal.

* * * * *